United States Patent
Chen et al.

(10) Patent No.: US 11,705,200 B2
(45) Date of Patent: Jul. 18, 2023

(54) VAN DER WAALS HETEROSTRUCTURE MEMORY DEVICE AND SWITCHING METHOD

(71) Applicants: National University of Singapore, Singapore (SG); National University of Singapore (Suzhou) Research Institute, Jiangsu (CN)

(72) Inventors: Wei Chen, Singapore (SG); Du Xiang, Singapore (SG); Tao Liu, Singapore (SG)

(73) Assignees: National University of Singapore and, Jiangsu (CN); National University of Singapore (Suzhou) Research, Jiangsu (CN)

( * ) Notice: Subject to any disclaimer, the term of this patent is extended or adjusted under 35 U.S.C. 154(b) by 80 days.

(21) Appl. No.: 17/338,074

(22) Filed: Jun. 3, 2021

(65) Prior Publication Data
US 2021/0391009 A1    Dec. 16, 2021

(30) Foreign Application Priority Data
Jun. 10, 2020  (SG) .......................... 10202005480Y

(51) Int. Cl.
*G11C 13/04* (2006.01)
*H10B 63/00* (2023.01)
(Continued)

(52) U.S. Cl.
CPC ........... *G11C 13/047* (2013.01); *H10B 63/30* (2023.02); *H10N 70/011* (2023.02);
(Continued)

(58) Field of Classification Search
CPC .............. G11C 13/047; H01L 27/2436; H01L 45/1213; H01L 45/144; H01L 45/143;
(Continued)

(56) References Cited

U.S. PATENT DOCUMENTS

| 8,970,939 B2* | 3/2015 | Chui | ................... | G02B 26/001 |
| | | | | 359/298 |
| 9,001,412 B2* | 4/2015 | Chui | ................... | G02B 26/023 |
| | | | | 345/85 |

(Continued)

FOREIGN PATENT DOCUMENTS

| EP | 3542402 A1 | 5/2018 |
| WO | 2018009931 A1 | 1/2018 |

OTHER PUBLICATIONS

Junli Du et al, "Piezotronic effect on interfacial charge modulation in mixed-dimensional Van der Waals Heterostructures for ultrasensitive flexible photodetectors", Apr. 2019, ScienceDirect.com, vol. 58, pp. 85-93. (Year: 2019).*

(Continued)

*Primary Examiner* — Viet Q Nguyen
(74) *Attorney, Agent, or Firm* — Michael Best & Friedrich LLP

(57) ABSTRACT

A method of switching between first and second states of a van der Waals heterostructure, vdWH, memory device, a vdWH memory device, and a method of fabricating a vdWH memory device. The vdWH memory device comprises a first two-dimensional, 2D, material; and a second 2D material, wherein, in a first storage state of the memory device, an interface between the first and second 2D material comprises interfacial states; and wherein, in a second storage state of the memory device, interfacial states are modulated compared to the first memory state.

17 Claims, 7 Drawing Sheets

(51) Int. Cl.
*H10N 70/00* (2023.01)
*H10N 70/20* (2023.01)
(52) U.S. Cl.
CPC ....... *H10N 70/257* (2023.02); *H10N 70/8825* (2023.02); *H10N 70/8828* (2023.02); *H10N 70/8833* (2023.02)
(58) Field of Classification Search
CPC ..... H01L 45/146; H01L 45/16; H10N 70/257; H10N 70/8828; H10N 70/8833; H10N 70/8825; H10N 70/011; H10B 63/30
USPC ......................................................... 365/215
See application file for complete search history.

(56) References Cited

U.S. PATENT DOCUMENTS

| | | | |
|---|---|---|---|
| 9,449,851 | B2 | 9/2016 | Wong et al. |
| 9,865,811 | B2* | 1/2018 | Troyan ................ H01L 45/1206 |
| 2018/0158913 | A1 | 6/2018 | Withers et al. |
| 2020/0027921 | A1 | 1/2020 | Liu et al. |
| 2021/0098611 | A1* | 4/2021 | Hersam ............... H01L 29/7394 |
| 2021/0297878 | A1* | 9/2021 | Mondragon ......... G06N 3/0445 |

OTHER PUBLICATIONS

Hongchen Ruan et al, "Emerging Artificial Two-Dimensional van der Waals Heterostructures for Optoelectronics", Aug. 2019, researchgate.net, DOI:10.5772/intechopen.88433. (Year: 2019).*
Jing-Yu Mao et al, "Photonic Memristor for future computing: a Perspective", Mar. 2019, Advanced Science News magazine, vol. 7, article 1900766, pp. 1-15. (Year: 2019).*
Seunghwan Seo et al, "Artificial van der Waals hybrid synapse and its application to acoustic pattern recognition", Aug. 2020, Nature Communications Magazine, vol. 11, article 3936 (Year: 2020).*
Feichi Zhou et al, "2D Materials Based Optoelectronic Memory: Convergence of Electronic Memory and Optical Sensor", Aug. 2019, SPJ Research magazine, spjscience.org, vol. 2019, article ID 9490413. (Year: 2019).*
Siyu Zhou et al. , "Non-volatile optical memory in vertical van der Waals Heterostructures", 2020, iopscience.iop.org, Journal of semiconductors, vol. 41, No. 7, article 072906. (Year: 2020).*
Feng Wang et al. "Strong electrically tunable MoTe2/graphene van der Waals heterostructures for highperformance electronic and optoelectronic devices," Appl. Phys. Lett. 109, 193111 (2016).
Sun et al., "Self-selective van der Waals heterostructures for large scale memory array," Nature Communications (2019) 10:3161.
Varghese, et al., "Near-direct bandgap WSe2/ReS2 type-II pn heterojunction for enhanced ultrafast photodetection anti high-performance photovoltaics," Submitted Oct. 27, 2019; originally announced Oct. 2019. Cornell University, arXiv (https://arxiv.org/ftp/arxiv/papers/1910/1910.12386).
Cheng et al., "High-performance, multifunctional devices based on asymmetric van der Waals heterostructures," Nature Electronics, 356 vol. 1, Jun. 2018 (pp. 356-361); www.nature.com/natureelectronics.
Li, et al., "Van derWaals Heterostructure Based Field Effect Transistor Application," Crystals 2018, 8, 8; doi:10.3390/cryst8010008 (pp. 1-23).
Grzeszcyk et al., "The effect of hexagonal boron nitride encapsulation on interlayer interactions in few-layer molybdenum ditelluride," (Aug. 28, 2019).
Wang, Q. H., Kalantar-Zadeh, K., Kis, A., Coleman, J. N. & Strano, M. S., "Electronics and optoelectronics of two-dimensional transition metal dichalcogenides," Nat. Nanotechnol., 7, 699-712 (2012).
Lin, Z., Huang, Y. & Duan, X., "Van der Waals thin-film electronics," Nat. Electron. 2, 378-388, doi:10.1038/s41928-019-0301-7 (2019).
Liu, C. et al., "A semi-floating gate memory based on van der Waals heterostructures for quasi-non-volatile applications," Nat. Nanotechnol. 13, 404-410, doi:10.1038/s41565-018-0102-6 (2018).
Lee, J. et al. "Monolayer optical memory cells based on artificial trap-mediated charge storage and release," Nat. Commun. 8, 14734 (2017).
Li, J. et al. "Symmetric Ultrafast Writing and Erasing Speeds in Quasi Nonvolatile Memory via van der Waals Heterostructures," Adv. Mater. 31, 1808035 (2019).
Novoselov, K., Mishchenko, A., Carvalho, A. & Neto, A. C. "2D materials and van der Waals heterostructures," Science 353, aac9439 (2016).
Geim, A. K. & Grigorieva, I. V., "Van der Waals heterostructures," Nature 499, 419-425 (2013).
Liu, Y. et al. "Van der Waals heterostructures and devices," Nat. Rev. Mater. 1, 16042 (2016).
Gundavarapu, S. et al. "Sub-hertz fundamental linewidth photonic integrated Brillouin laser," Nat. Photon. 13, 60-67 (2019).
Zhou, Z. et al., "On-chip light sources for silicon photonics," Light Sci. Appl. 4, e358 (2015).

* cited by examiner

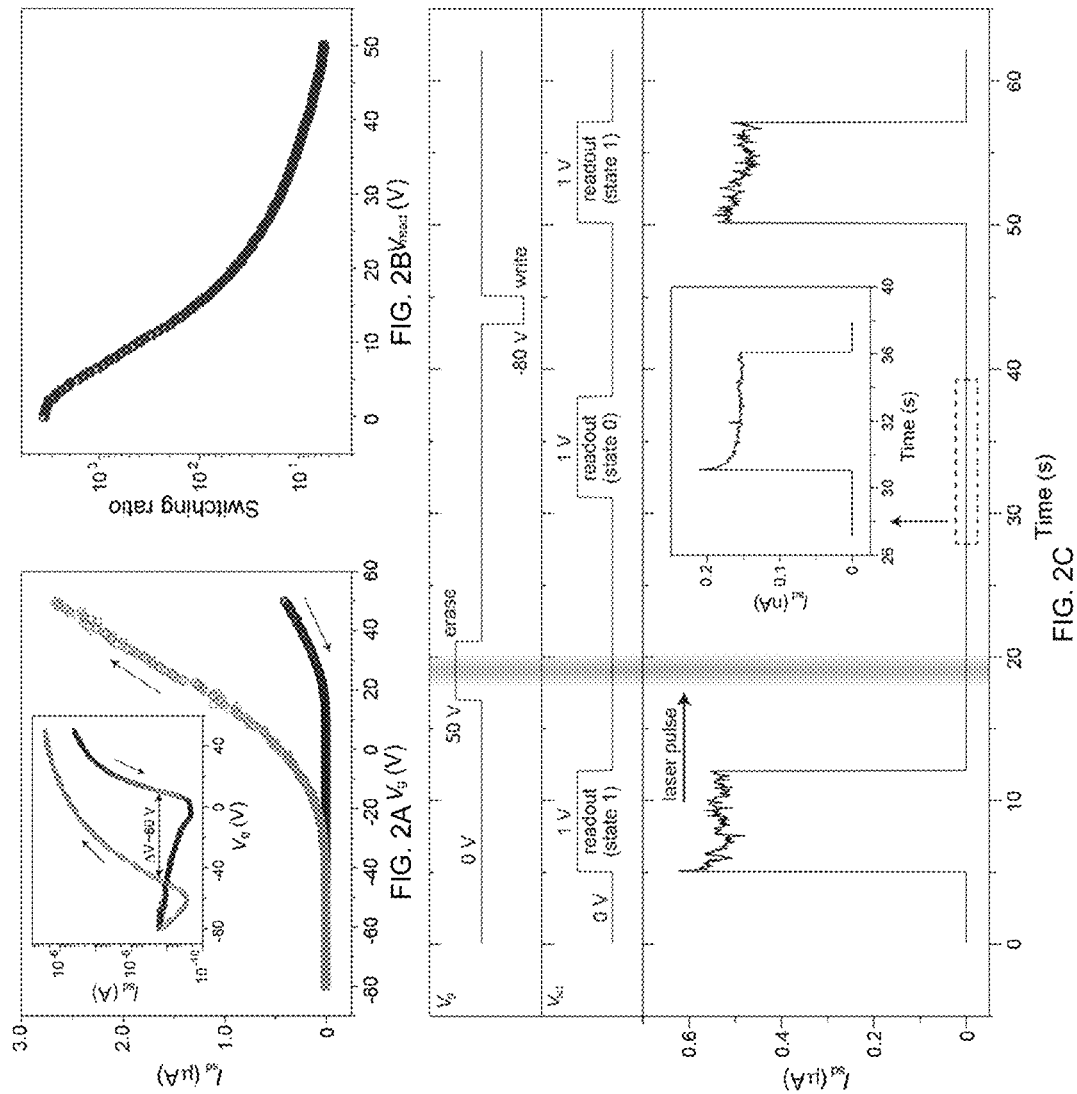

VAN DER WAALS HETEROSTRUCTURE MEMORY DEVICE AND SWITCHING METHOD

CROSS-REFERENCE TO RELATED APPLICATION

This application claims the benefit of priority of Singapore Patent Application No. 10202005480Y filed on Jun. 10, 2020, the content of which is incorporated herein by reference in its entirety for all purposes.

FIELD OF INVENTION

The present invention relates broadly to a method of switching between first and second states of a van der Waals heterostructure, to a van der Waals heterostructure memory device, and to a method of fabricating a van der Waals heterostructure memory device, specifically to an artificially created interfacial states enabled van der Waals heterostructure memory device.

BACKGROUND

Any mention and/or discussion of prior art throughout the specification should not be considered, in any way, as an admission that this prior art is well known or forms part of common general knowledge in the field.

Two-dimensional (2D) layered materials have been a central focus of materials research, due to their unique and extraordinary properties for the next-generation nanoelectronics [1]. The discovery of graphene has sparked intense interest in a wide range of 2D materials, including conductors, semiconductors with varying bandgaps (such as transition-metal dichalcogenides (TMDs), black phosphorus), and insulators (such as boron nitride (BN)) [1]. The interactions between the adjacent layers of these 2D layered materials are usually characterized by van der Waals forces with fully saturated chemical bonds on their surface, which allows the heterogenous integration of 2D materials at the atomic scale without the restrictions from lattice mismatch and processing compatibility [2]. Additionally, the design and stack of the extensive library of 2D crystals with selected properties have enabled the emergence of various van der Waals heterostructures (vdWHs) with novel physical phenomena and device functionality, such as memory devices, tunneling transistors, light emitting diodes, and atomically thin p-n junctions [3-8]. Among these, the 2D vdWH memories have attracted tremendous attention, arising from their great potential to break through the von Neuman bottleneck in current computing architecture, and boost the storage capacity of memory chips for the post-Moore era. The 2D atomic layered structure of the vdWH memories enables them to extend the scaling limit existing in the conventional bulk memory counterparts. In addition, benefiting from the rich band structures of 2D materials, high performance memory device with stable data storage can be implemented through proper energy band engineering.

While the property of each individual constituent in a vdWH is important in achieving desired device functionality, the heterostructure interface plays a predominate role in determining its actual performance due to the atomically thin structure and high surface-to-volume ratio of 2D layered materials [8]. Previous works largely focus on the suppression of the emergence of the interfacial states and charge traps, in order to minimize the unexpected charge transfer and interaction between the heterostructure stackings [7]. However, presently there is still a limit towards new architectures of 2D memories and other 2D electronic/optoelectronic devices.

Embodiments of the present invention seek to address at least one of the above problems.

SUMMARY

In accordance with a first aspect of the present invention, there is provided a method of switching between first and second states of a van der Waals heterostructure, vdWH, memory device comprising a first two-dimensional, 2D, material and a second 2D material with an interface therebetween, the method comprising the steps of:

exposing the interface to a laser beam while applying an erase voltage signal across the interface for creating interfacial states according to a first storage state of the memory device; and applying a write voltage signal across the interface for modulating the interfacial states according to a second state of the memory device.

In accordance with a second aspect of the present invention, there is provided a van der Waals heterostructure, vdWH, memory device comprising:

a first two-dimensional, 2D, material; and a second 2D material, wherein, in a first storage state of the memory device, an interface between the first and second 2D material comprises interfacial states; and wherein, in a second storage state of the memory device, interfacial states are modulated compared to the first memory state.

In accordance with a third aspect of the present invention, there is provided a method of fabricating a van der Waals heterostructure, vdWH, memory device, comprising the steps of:

providing a first two-dimensional, 2D, material;

providing a second 2D material, with an interface between the first 2D material and the second 2D material;

wherein the interface is configured such that, in a first storage state of the memory device, the interface between the first and second 2D material comprises interfacial states and such that in a second storage state of the memory device, interfacial states are modulated compared to the first memory state.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 2A shows the transfer characteristics of the vdWH device according to an example embodiment in dark condition after the initialization process.

FIG. 2B shows the switching ratio as a function of readout voltage Vread. for the device according to an example embodiment.

FIG. 2C shows a graph illustrating a dynamic write-erase process of the vdWH device according to an example embodiment. The gray shadow represents that the laser beam is on. Inset shows the output current of the memory after erasing.

DETAILED DESCRIPTION

Embodiments of the present invention can provide a two-dimensional (2D) non-volatile van der Waals heterostructures (vdWH) memory device enabled by the artificially created interfacial states between hexagonal boron nitride (hBN) and molybdenum ditelluride ($MoTe_2$). The memory originates from the microscopically coupled optical and electrical responses of the vdWH, with the high reliability reflected by its long data retention time over $10^4$ s and large write-erase cyclic number exceeding 100, according to an example embodiment. Moreover, the storage currents in the memory according to an example embodiment can be precisely controlled by the writing and erasing gates, demonstrating the tunability of its storage states.

In an example embodiment, the interfacial states can be effectively modulated through microscopically controlling the optical and electrical responses of the vdWH, which leads to distinct storage states in the memory.

Embodiments of the present invention can make it possible to realize a high performance 2D non-volatile vdWH memory device.

Fabrication of 2D $MoTe_2$/hBN vdWH Device According to an Example Embodiment

Figure 1A:
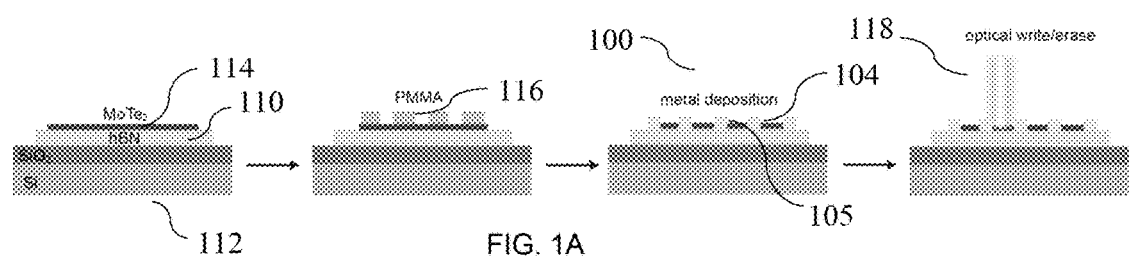
FIG. 1A shows schematic cross-sectional drawings illustrating a fabrication process of a vdWH according to an example embodiment.

The hybrid structure of $MoTe_2$ and hBN according to an example embodiment was achieved by a dry transfer method in a glovebox (Ar atmosphere). With reference to FIG. 1A, multilayer hBN 110 flake was firstly mechanically exfoliated onto Si substrate 112 coated with 300 nm $SiO_2$ dielectric. In the following, the $MoTe_2$ 114 flake exfoliated on a transparent polydimethylsiloxane (PDMS) substrate was aligned on the hBN flake using an optical microscope. After the alignment, the PDMS film was pressed on the $SiO_2$/Si substrate 110 for ~2 minutes followed by a slow lift up, during which the $MoTe_2$ 114 flake was transferred onto the hBN 110 flake. After transfer, the vdWH (110, 114) was spin coated by poly(methyl methacrylate) (PMMA) 116 in the same glovebox for device fabrication. The standard e-beam lithography (EBL) was performed to define the $MoTe_2$ memory channel and the electrical contacts, after which the metal electrodes (Cr/Au) e.g. 104 were deposited using thermal evaporation. After liftoff of the PMMA 115 layer in acetone solution, the vdWH device 100 according to an example embodiment was wire-bonded onto a chip carrier and loaded into a high vacuum chamber (pressure approximately $10^{-7}$ mbar) for characterizations.

Electrical Characterization of the vdWH Memory Devices According to Example Embodiments The devices according to example embodiments were characterized in a high vacuum chamber (~$10^{-7}$ mbar). The electrical measurements were conducted by using an Agilent 2912A source measure unit. A micro-sized laser beam with wavelength 405 nm was used to modulate the memory performance. The light intensity of the laser beam was calibrated by THORLABS GmbH (PM 100A) power meter.

Results and Analysis of Example Embodiments

Referring again to FIG. 1A, in the device fabrication process according to an example embodiment the few-layer hBN 110 is mechanically exfoliated onto $SiO_2$/Si substrate 112, followed by the dry transfer of $MoTe_2$ 114 flake. The metal contacts e.g. 104 are thermally deposited on the $MoTe_2$ 114 channel. FIG. 1C demonstrates the optical microscopy image of the as-fabricated $MoTe_2$/hBN vdWH device 100 according to an example embodiment in a back-gated field-effect-transistor (FET) configuration. For each pair of contacts e.g. 104, 105, there is one source and one drain. There is no restriction for which is which, since the contacts are symmetry to each other. The measurements presented below were obtained between one pair of contacts at a time, using a gate electrode at the back of the Si/SiO2 substrate 112.

The Raman measurement reveals the crystallinity of the MoTe$_2$ flake (FIG. 1D), with three characteristic peaks located at ~172 cm$^{-1}$, 235 cm$^{-1}$, and 291 cm$^{-1}$, respectively. The hBN flake exhibits a single Raman characteristic peak at ~1365 cm$^{-1}$. FIG. 1E shows the transfer curve ($I_{sd}$-$V_g$) of the pristine MoTe$_2$ transistor on hBN flake in both linear and logarithm (inset) scales under bias voltage $V_{sd}$=1.0 V, which exhibits a typical n-type dominated ambipolar transport behavior. It is noted that the transfer curve shows weak hysteresis under the backward ($V_g$ from 50 V to −80 V) and forward ($V_g$ from −80 V to 50 V) sweepings, indicating the negligible trapping charges at the pristine MoTe$_2$/hBN interface.

Figure 1B:
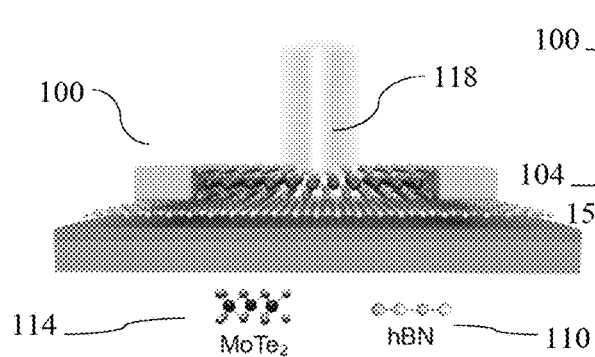
FIG. 1B shows schematic perspective side view of a vdWH according to an example embodiment.
Figure 1C:
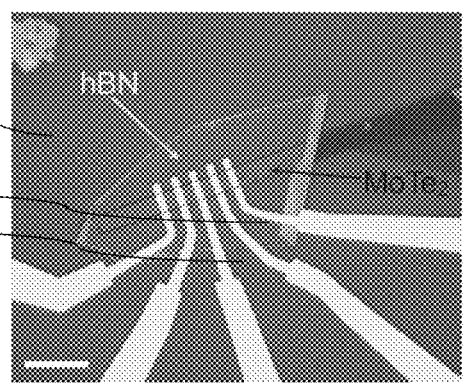
FIG. 1C shows an optical microscopy image of a $MoTe_2$/hBN vdWH according to an example embodiment.
Figure 1D:
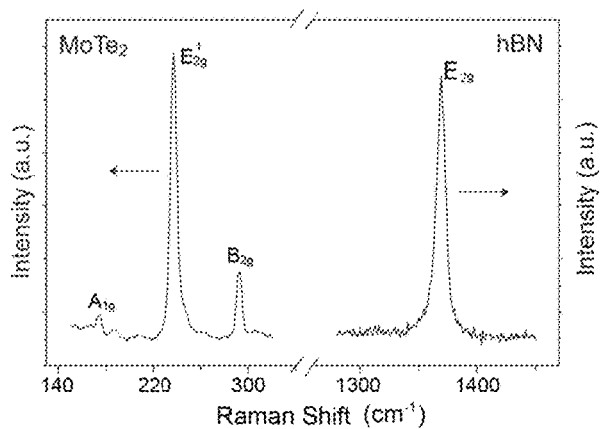
FIG. 1D shows the Raman characterization of the exfoliated $MoTe_2$ and hBN flakes of the vdWH of FIG. 1C.
Figure 1E:
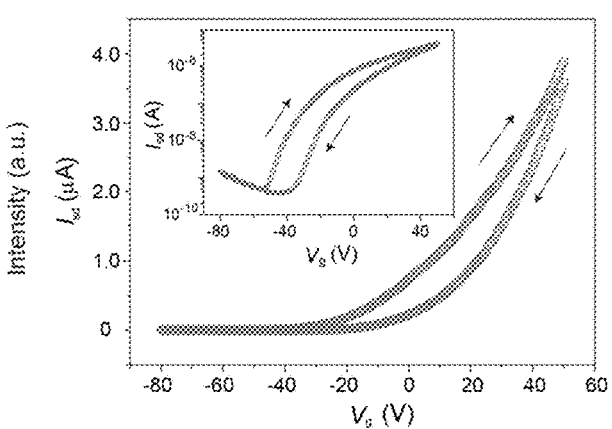
FIG. 1E shows the transfer characteristics of the $MoTe_2$ transistor on hBN substrate in the vdWH of FIG. 1C, both linear and logarithm (inset) scales. The bias voltage $V_{sd}$ is 1.0 V.

With reference to FIGS. 1A and 1B, a laser beam 118 (λ=405 nm) was then employed to expose the device 100 under a positive gate $V_g$=50 V and zero bias, a process which is denoted as initialization. The laser beam 118 was fine-focused on one channel (between one pair of electrodes) at a time. The laser intensity is calibrated at around 200 mW/cm$^2$, and the exposure time is 2 s. After the initialization, the transfer curve (FIG. 2A) was swept in both the backward and forward directions in dark condition again. Intriguingly, the transfer characteristic demonstrates a remarkable hysteresis and threshold voltage ($V_{th}$) shift ΔV (i.e. memory window) ~60 V during the bi-directional sweeping, which indicates a significant memory behavior. To further investigate such memory behavior, the dynamic 'write-erase' process was carried out on the device according to an example embodiment to set the device to state '1' and state '0', as shown in FIG. 2C. The readout of pristine channel current is ~0.5 μA under $V_{sd}$=1.0 V and $V_g$=0 V, which is assigned as state '1', and consistent with the transfer characterization in FIG. 1E. The same initialization process was then conducted to erase the channel current, followed by the readout operation. The output current is dramatically reduced to a low level of ~0.15 nA (inset of FIG. 2C), suggesting that the device is in state '0'. The reduction of the current is due to charge being "scattered" at the artificial interfacial states created during initialization. Additionally, the erased current is maintained without significant change under $V_{sd}$=1.0 V, illustrating its non-volatility. A negative gate pulse ($V_g$=−80 V, duration ~2 s) is then used to write the device, which reverts the output current to its original level, and the device returns to state '1'. To evaluate the distinguishability of the storage states in the memory device, the switching ratio R was calculated as R=$I_{written}$/$I_{erased}$, which is defined as the output current ratio between the state '1' and state '0'.

As shown in FIG. 2B, R is estimated to be ~3×10$^3$ at $V_{read}$=0 V, which gradually decays as the readout voltage is increased to ~50 V. This large switching ratio indicates the significant current difference between the written and erased states, which is very promising for multibit data storage application according to example embodiments. It is noted that the integration of micro-size laser beam in the device chip according to an example embodiment is involved for the development of the MoTe$_2$/hBN vdWH memory. The photonic chip which can act as laser beam source has been realized with high performance by choosing suitable materials or carefully designing the chip configuration [9,10]. Based on these advanced photonic chip technology, the micro-size laser beam can be integrated in a memory in a practical device package according to an example embodiment.

Figure 3A:
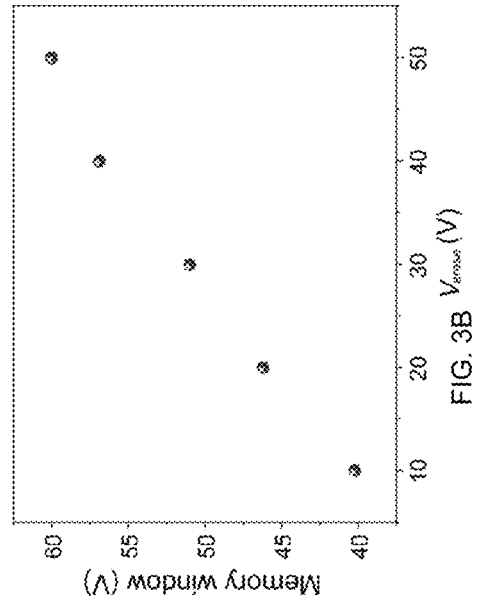
FIG. 3A shows the transfer characteristics evolution of the vdWH memory according to an example embodiment after erasing under different erasing gates from 10 V to 50 V.
Figure 3B:
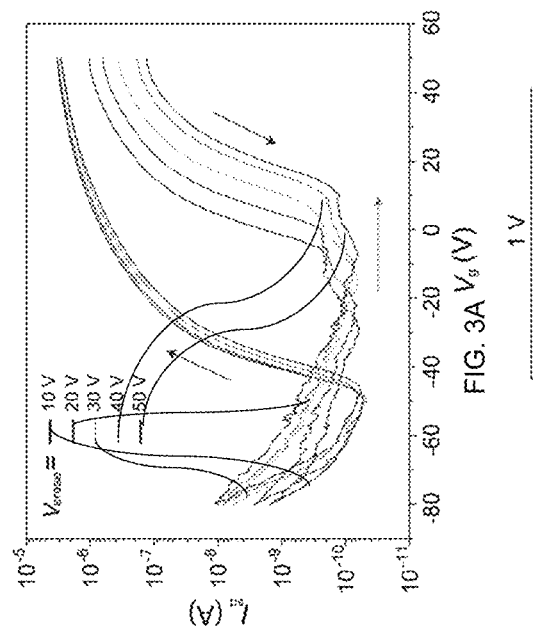
FIG. 3B shows the memory window as a function of erasing gate of the vdWH memory according to an example embodiment.
Figure 3C:
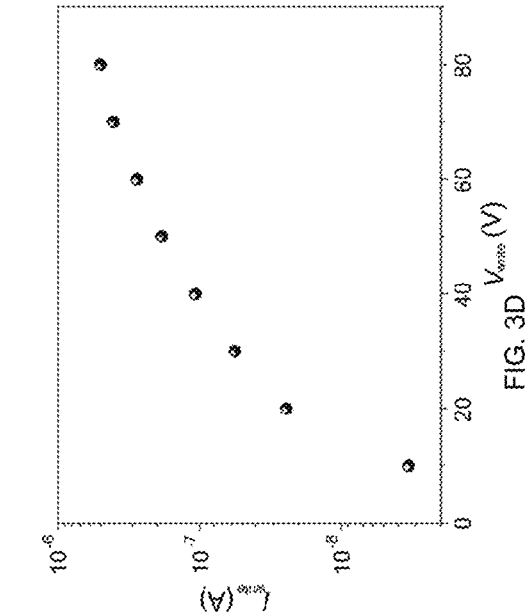
FIG. 3C shows the readout of the storage current after writing at different writing gates from −20 V to −80 V of the vdWH memory according to an example embodiment. The current is readout under bias Vsd=0.1 V and gate Vread=0 V.
Figure 3D:
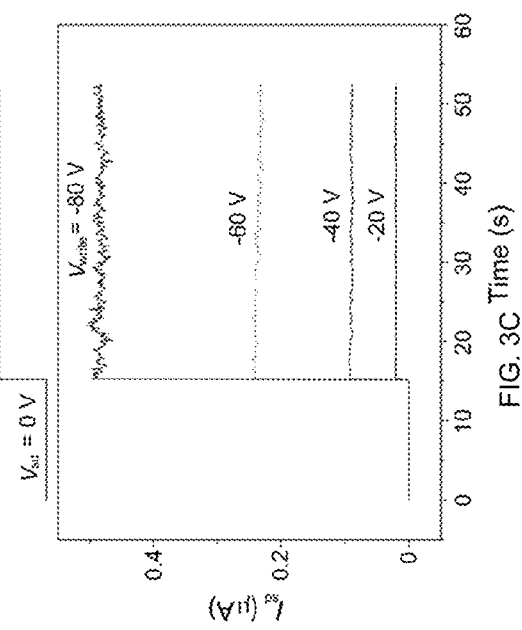
FIG. 3D shows the output current as a function of writing gate of the vdWH memory according to an example embodiment.

FIG. 3A shows the transfer characteristics evolution of the vdWH memory according to an example embodiment in bi-directional sweeping under different erasing gate ($V_{erase}$ from 10 V to 50 V). The backward transfer curve keeps positively shifting as the erasing gate increases from 10 V to 50 V, leading to a progressively enlarged hysteresis and memory window from ~40 V to ~60 V (FIG. 3B). These results illustrate the performance tunable characteristics of the vdWH memory according to an example embodiment via controlling the erasing gate. In addition to the erasing gate, the memory performance can also be modulated by the writing gate, as shown in FIG. 3C and 3D. The output current $I_{written}$ in storage state '1' gradually rises from ~3.3 nA to ~500 nA, with increasing the $V_{write}$ from −10 V to −80 V, illustrating the tunable nature of the $I_{written}$ in a wide range.

Figure 4A:
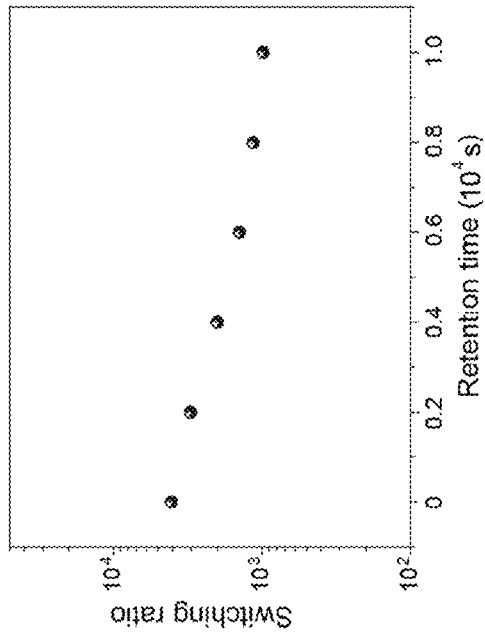
FIG. 4A shows the evolution of the storage current versus retention time of the vdWH memory according to an example embodiment.
Figure 4B:
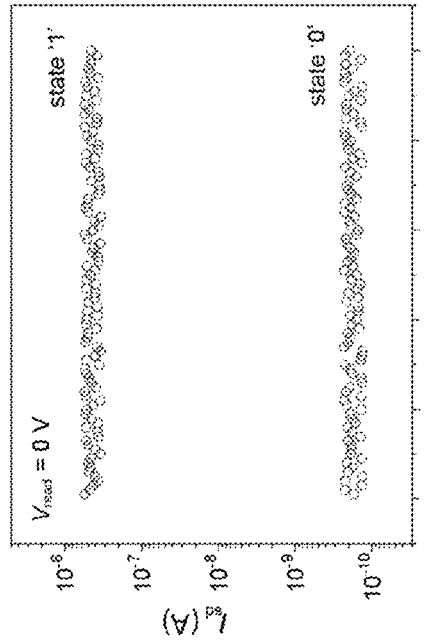
FIG. 4B shows the evolution of the switching ratio versus retention time of the vdWH memory according to an example embodiment.
Figure 4C:
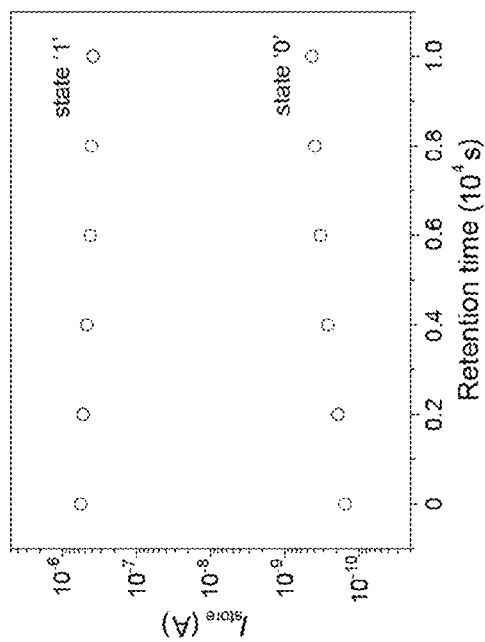
FIG. 4C shows the evolution of the transfer characteristics of the memory at different cyclic number of the vdWH memory according to an example embodiment.
Figure 4D:
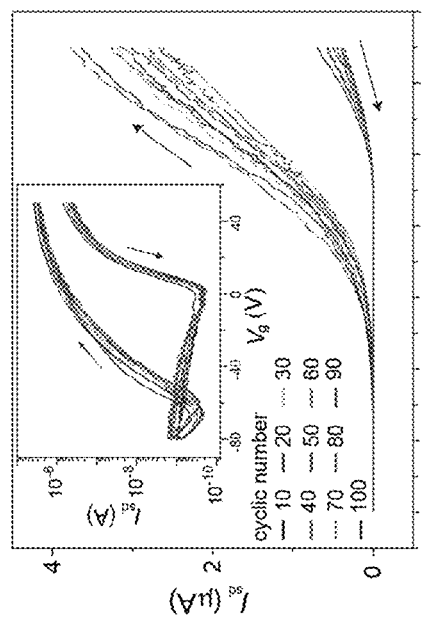
FIG. 4D shows the evolution of the extracted storage current in both states '0' and '1' as a function of cyclic number of the vdWH memory according to an example embodiment.

To evaluate the reliability of the vdWH memory device according to an example embodiment, the data retention capability and cyclic write-erase endurance are investigated. FIG. 4a shows the output current (under $V_{sd}$=1.0 V and $V_g$=0 V) as a function of waiting time up to 10$^4$ s, at different storage states '0' and '1'. It is noted that the memory was kept isolated from the external perturbations (such as electric field and light) after erasing or writing, and the output currents were readout in a fixed interval of 2×10$^3$ s. Despite of the gradual evolution of the output currents, both the written and erased currents are nearly retained without significant change as prolonging the retention time to 10$^4$ s. Additionally, the switching ratio can still maintain at a high level around 1.1×10$^3$ (FIG. 4b), illustrating the high distinguishability of the states '0' and '1' throughout this retention period. These results reveal the excellent non-volatile property of the memory device according to an example embodiment. The write-erase dynamical process was also repeated for 100 cycles, with the bi-directional transfer characteristics for the selected cycles shown in FIG. 4C. The transfer curves under the different cycles are almost overlapped with each other in both the backward and forward sweeping directions, indicating the outstanding repeatability of the memory according to an example embodiment. The output currents in both storage state '0' and '1' are extracted at $V_{read}$=0 V from the transfer characterization, and plotted as a function of cyclic number in FIG. 4D. The currents demonstrate weak fluctuation in their corresponding storage state in the 100 cycles. Moreover, the deviation from the average values of both the written and erased currents for each $V_{read}$ is within 50%, further revealing that the output currents are highly-reproducible. Given the robust data retention capability and cyclic endurance, the interfacial states assisted vdWH memory demonstrates great potential for non-volatile data storage.

Figure 8A:
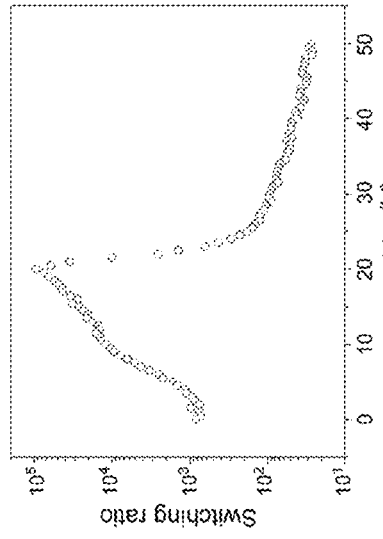
FIG. 8A shows the transfer characteristics of the vdWH device according to an example embodiment in dark condition after the initialization process.
Figure 8B:
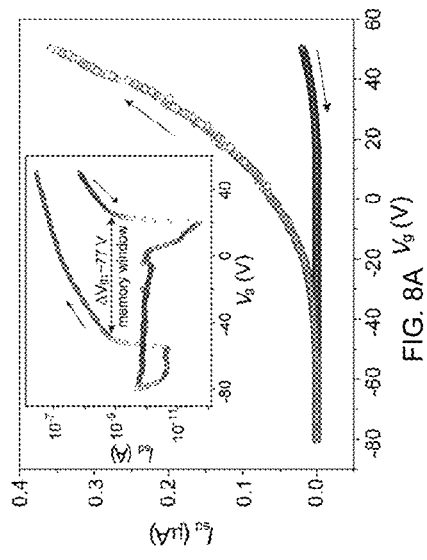
FIG. 8B shows the switching ratio as a function of readout voltage Vread. for the device according to an example embodiment.
Figure 8C:
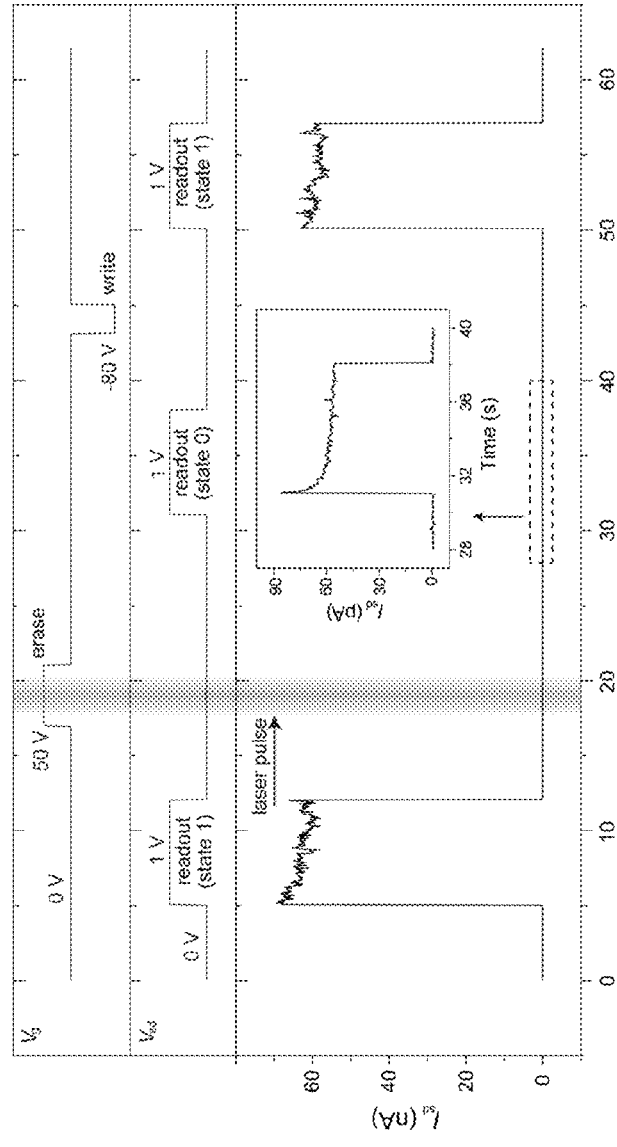
FIG. 8C shows a graph illustrating a dynamic write-erase process of the vdWH device according to an example embodiment. The gray shadow represents that the laser beam is on. Inset shows the output current of the memory after erasing.

In another example embodiment, a WSe$_2$/hBN memory was fabricated and analyzed. FIGS. 8A-C show the device performance of the WSe$_2$/hBN memory according to an example embodiment, which is similar to the MoTe$_2$/hBN memory in FIGS. 2A-C. Again, a laser beam 118 (λ=405 nm) was employed to expose the device under a positive gate $V_g$=50 V and zero bias, a process which is denoted as initialization. The laser beam was fine-focused on one channel (between one pair of electrodes) at a time. The laser intensity is calibrated at around 200 mW/cm$^2$, and the exposure time is 2 s. After the initialization, the transfer curve (FIG. 8A) was swept in both the backward and forward directions in dark condition again. Again, the transfer characteristic demonstrates a remarkable hysteresis and threshold voltage ($V_{th}$) shift ΔV (i.e. memory window) ~77 V during the bi-directional sweeping, which indicates a significant memory behavior. To further investigate such memory behavior, the dynamic 'write-erase' process was carried out on the device according to an example embodiment to set the device to state '1' and state '0', as shown in FIG. 8C. The readout of pristine channel current is ~60 nA under $V_{sd}$=1.0 V and $V_g$=0 V, which is assigned as state '1'. The same initialization process was then conducted to erase the channel current, followed by the readout operation. The output current is dramatically reduced to a low level of ~60 pA (inset of FIG. 8C), suggesting that the device is in state '0'. Again, the reduction of the current is due to charge being "scattered" at the artificial interfacial states created during initialization. Additionally, the erased current is maintained without significant change under $V_{sd}$=1.0 V, illustrating its non-volatility. A negative gate pulse ($V_g$=−80 V, duration ~2 s) is then used to write the device, which reverts the output current to its original level, and the device returns to state '1'. To evaluate the distinguishability of the storage states in the memory device, the switching ratio R was calculated as $R=I_{written}/I_{erased}$, which is defined as the output current ratio between the state '1' and state '0'. There is a difference in the threshold voltage $V_{th}$ of different devices/materials, in the sweeping direction from positive voltage to negative voltage. In $MoTe_2$ device (compare FIG. 2) the $V_{th}$ is around 0V, while in $WSe_2$ (compare FIG. 8) the $V_{th}$ is ~20V. The switching ratio maximum occurs at the value of $V_{th}$.

Figure 5:
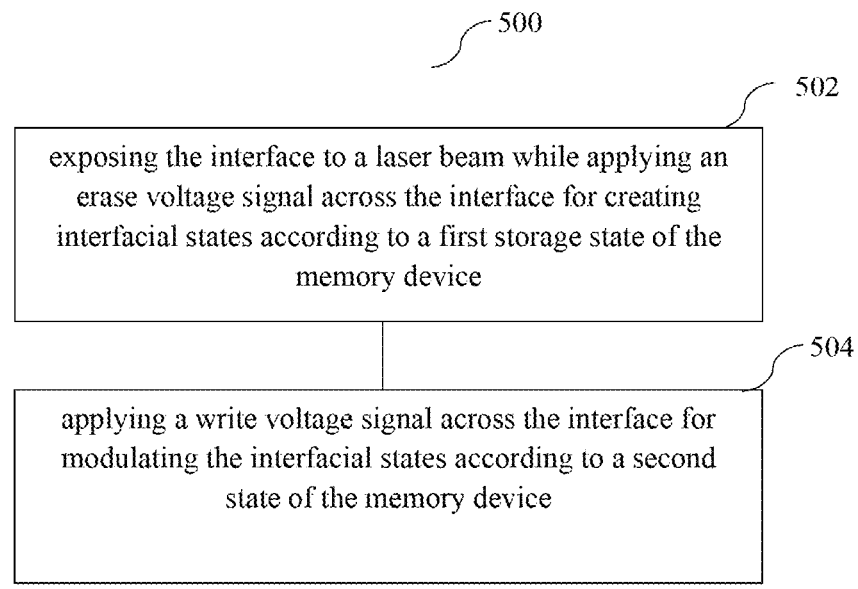
FIG. 5 shows a flowchart illustrating a method of switching between first and second states of a van der Waals heterostructure, vdWH, memory device comprising a first two-dimensional, 2D, material and a second 2D material with an interface therebetween, according to an example embodiment.

FIG. 5 shows a flowchart 500 illustrating a method of switching between first and second states of a van der Waals heterostructure, vdWH, memory device comprising a first two-dimensional, 2D, material and a second 2D material with an interface therebetween, according to an example embodiment. At step 502, the interface is exposed to a laser beam while applying an erase voltage signal across the interface for creating interfacial states according to a first storage state of the memory device. At step 504. a write voltage signal is applied across the interface for modulating the interfacial states according to a second state of the memory device.

The vdWH memory device may comprise the second 2D material as a channel on the first 2D material in a field-effect transistor configuration comprising a gate electrode, a source electrode and a drain electrode, and the method comprises applying the erase voltage signal to the gate electrode with a zero bias voltage between the source electrode and the drain electrode.

The method may comprise applying the write voltage signal to the gate electrode with a zero bias voltage between the source electrode and the drain electrode.

The gate electrode may be disposed as a back gate electrode.

The first storage state of the memory device may be characterized by a first output current with a reading voltage applied between the source electrode and the drain electrode in dark condition.

The second storage state of the memory device may be characterized by a second output current larger than the first reading current with the same reading voltage applied between the source electrode and the drain electrode in dark condition.

The first 2D material may comprise hexagonal boron nitride or other materials, such as metal oxides which contain large amounts of defects.

The second 2D material may comprise molybdenum ditelluride or other 2D semiconductors such as molybdenum disulfide, tungsten diselenide.

Figure 6:
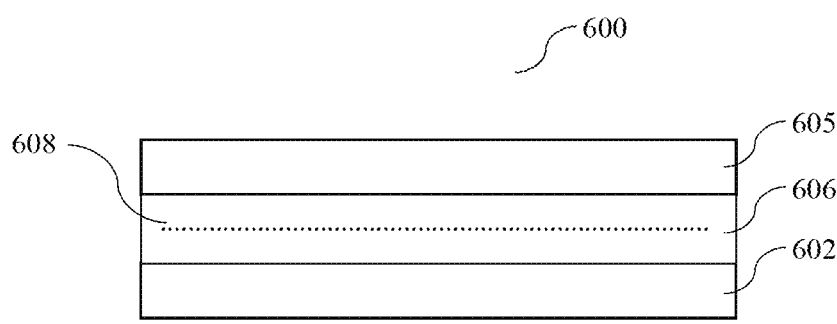
FIG. 6 shows a schematic drawings of a van der Waals heterostructure, vdWH, memory device 600 according to an example embodiment.

FIG. 6 shows a schematic drawings of a van der Waals heterostructure, vdWH, memory device 600 according to an example embodiment, comprising a first two-dimensional, 2D, material 602; and a second 2D material 605, wherein, in a first storage state of the memory device 600, an interface 606 between the first 2D material 602 and the second 2D material 605 comprises interfacial states e.g. 608; and wherein, in a second storage state of the memory device 600, interfacial states e.g. 608 are modulated compared to the first memory state.

The vdWH memory device 600 may be configured for exposing the interface 606 to a laser beam while applying an erase voltage signal across the interface 606 for setting the vdWH memory device 600 into the first memory state.

The vdWH memory device 600 may be configured for applying an erase voltage signal across the interface 606 for setting the vdWH memory device 600 into the second memory state.

The vdWH memory device 600 may comprise the second 2D material 605 as a channel on the first 2D material 602 in a field-effect transistor configuration comprising a gate electrode, a source electrode and a drain electrode.

The vdWH memory device 600 may be configured for applying the erase voltage signal to the gate electrode with a zero bias voltage between the source electrode and the drain electrode.

The vdWH memory device 600 may be configured for applying the write voltage signal to the gate electrode with a zero bias voltage between the source electrode and the drain electrode.

The gate electrode may be disposed as a back gate electrode.

The first storage state of the memory device 600 may be characterized by a first output current with a reading voltage applied between the source electrode and the drain electrode in dark condition.

The second storage state of the memory device may be characterized by a second output current larger than the first reading current with the same reading voltage applied between the source electrode and the drain electrode in dark condition.

The first 2D material 602 may comprise hexagonal boron nitride.

The second 2D material 605 may comprise molybdenum ditelluride or tungsten diselenide.

Figure 7:
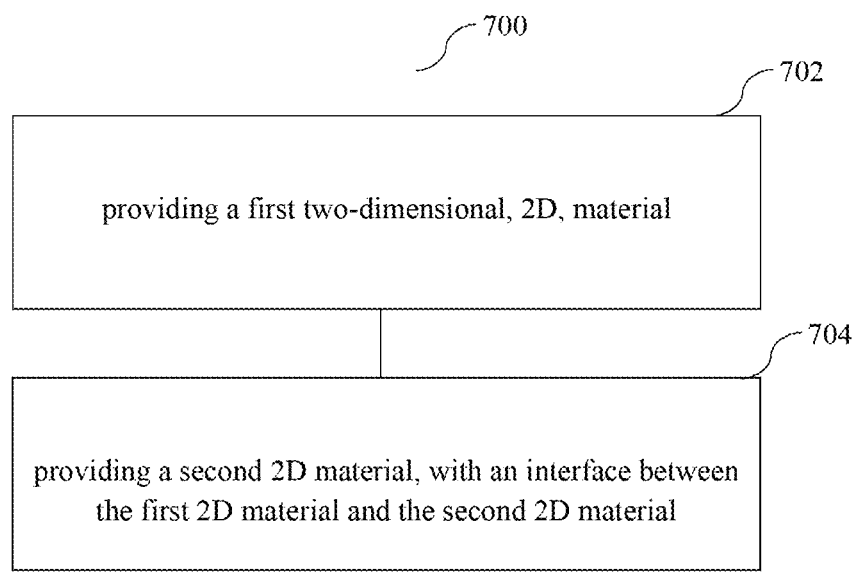
FIG. 7 shows a flowchart illustrating a method of fabricating a van der Waals heterostructure, vdWH, memory device, according to an example embodiment.

FIG. 7 shows a flowchart 700 illustrating a method of fabricating a van der Waals heterostructure, vdWH, memory device, according to an example embodiment. At step 702, a first two-dimensional, 2D, material is provided. At step 704, a second 2D material is provided, with an interface between the first 2D material and the second 2D material, wherein the interface is configured such that, in a first storage state of the memory device, the interface between the first and second 2D material comprises interfacial states and such that in a second storage state of the memory device, interfacial states are modulated compared to the first memory state.

As described above, a non-volatile vdWH memory device according to an example embodiment has been provided with the assistance of the artificially created interfacial states between $MoTe_2$ and hBN. The dynamic write-erase process has been repeated for 100 cycles with weak fluctuation of the transfer characteristics and output currents, indicating the outstanding reliability of the memory device according to example embodiments. On the other hand, both the written and erased currents can be maintained without significant decay in the retention time of ~$10^4$ s, which illustrates the excellent non-volatile characteristics of the memory according to example embodiments. Embodiments of the present invention provide for artificially producing and effectively modulating the interfacial states in vdWH, making it possible to realize high performance vdWH memory devices, opening up new opportunities to utilize interfacial-state engineering technique for the design and architecture of 2D electronic and optoelectronic devices according to various embodiments.

Embodiments of the present invention can have one or more of the following features and associated advantages:

| Feature | Benefit/Advantage |
| --- | --- |
| Interfacial states creation | The interfacial states in the vdWH can be created under light illumination to realize the memory effect. |
| High reliability | Long retention time over $10^4$ s and large write-erase cyclic number exceeding 100 |
| Gate controllable memory performance | The storage current can be easily controlled by the external gate voltages |

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features described for different embodiments, including in the summary section, even if the feature or combination of features is not explicitly specified in the claims or the detailed description of the present embodiments.

For example, in different embodiments other 2D semiconductors such as molybdenum disulfide may be used as the second 2D material.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

REFERENCES

[1] Wang, Q. H., Kalantar-Zadeh, K., Kis, A., Coleman, J. N. & Strano, M. S. Electronics and optoelectronics of two-dimensional transition metal dichalcogenides. Nat. Nanotechnol., 7, 699-712 (2012).

[2] Lin, Z., Huang, Y. & Duan, X. Van der Waals thin-film electronics. Nat. Electron. 2, 378-388, doi:10.1038/s41928-019-0301-7 (2019).

[3] Liu, C. et al. A semi-floating gate memory based on van der Waals heterostructures for quasi-non-volatile applications. Nat. Nanotechnol. 13, 404-410, doi:10.1038/s41565-018-0102-6 (2018).

[4] Lee, J. et al. Monolayer optical memory cells based on artificial trap-mediated charge storage and release. Nat. Commun. 8, 14734 (2017).

[5] Li, J. et al. Symmetric Ultrafast Writing and Erasing Speeds in Quasi Nonvolatile Memory via van der Waals Heterostructures. Adv. Mater. 31, 1808035 (2019).

[6] Novoselov, K., Mishchenko, A., Carvalho, A. & Neto, A. C. 2D materials and van der Waals heterostructures. Science 353, aac9439 (2016).

[7] Geim, A. K. & Grigorieva, I. V. Van der Waals heterostructures. Nature 499, 419-425 (2013).

[8] Liu, Y. et al. Van der Waals heterostructures and devices. Nat. Rev. Mater. 1, 16042 (2016).

[9] Gundavarapu, S. et al. Sub-hertz fundamental linewidth photonic integrated Brillouin laser. Nat. Photon. 13, 60-67 (2019).

[10] Zhou, Z. et al. On-chip light sources for silicon photonics. Light Sci. Appl. 4, e358 (2015).

The invention claimed is:

1. A method of switching between first and second states of a van der Waals heterostructure, vdWH, memory device comprising a first two-dimensional, 2D, material and a second 2D material with an interface therebetween, the method comprising the steps of:
   exposing the interface to a laser beam while applying an erase voltage signal across the interface for creating interfacial states according to a first storage state of the memory device;
   and applying a write voltage signal across the interface for modulating the interfacial states according to a second state of the memory device,
   wherein the vdHW memory devive comprises the second 2D material as a channel on the first 2D material in a field-effect transistor configuration comprising a gate electrode, a source electrode and a drain electrode, and the method comprises applying the erase voltage signal to the gate electrode with a zero bias voltage between the source electrode and the drain electrode.

2. The method of claim 1, comprising applying the write voltage signal to the gate electrode with a zero bias voltage between the source electrode and the drain electrode.

3. The method of claim 1, wherein the gate electrode is disposed as a back gate electrode.

4. The method of claim 1, wherein the first storage state of the memory device is characterized by a first output current with a reading voltage applied between the source electrode and the drain electrode in dark condition.

5. The method of claim 4, wherein the second storage state of the memory device is characterized by a second output current larger than the first reading current with the same reading voltage applied between the source electrode and the drain electrode in dark condition.

6. The method of claim 1, wherein the first 2D material comprises hexagonal boron nitride.

7. The method of claim 1, wherein the second 2D material comprises molybdenum ditelluride or tungsten diselenide.

8. A van der Waals heterostructure, vdWH, memory device comprising:
- a first two-dimensional, 2D, material; and
- a second 2D material as a channel on the first 2D material in a field-effect transistor configuration comprising a gate electrode, a source electrode and a drain electrode,
- wherein, in a first storage state of the memory device, an interface between the first and second 2D material comprises interfacial states;
- wherein, in a second storage state of the memory device, interfacial states are modulated compared to the first memory state; and
- wherein the vdWH memory device is configured for applying the erase voltage signal to the gate electrode with a zero bias voltage between the source electrode and the drain electrode.

9. The vdWH memory device of claim 8, configured for exposing the interface to a laser beam while applying an erase voltage signal across the interface for setting the vdWH memory device into the first memory state.

10. The vdWH memory device of claim 8, configured for applying an erase voltage signal across the interface for setting the vdWH memory device into the second memory state.

11. The vdWH memory device of claim 8, configured for applying the write voltage signal to the gate electrode with a zero bias voltage between the source electrode and the drain electrode.

12. The vdWH memory device of claim 8, wherein the gate electrode is disposed as a back gate electrode.

13. The vdWH memory device of claim 8, wherein the first storage state of the memory device is characterized by a first output current with a reading voltage applied between the source electrode and the drain electrode in dark condition.

14. The vdWH memory device of claim 13, wherein the second storage state of the memory device is characterized by a second output current larger than the first reading current with the same reading voltage applied between the source electrode and the drain electrode in dark condition.

15. The vdWH memory device of claim 8, wherein the first 2D material comprises hexagonal boron nitride.

16. The vdWH memory device of claim 8, wherein the second 2D material comprises molybdenum ditelluride or tungsten diselenide.

17. A method of fabricating a van der Waals heterostructure, vdWH, memory device, comprising the steps of:
- providing a first two-dimensional, 2D, material;
- providing a second 2D material as a channel on the first 2D material in a field-effect transistor configuration comprising a gate electrode, a source electrode and a drain electrode, with an interface between the first 2D material and the second 2D material;
- wherein the interface is configured such that, in a first storage state of the memory device, the interface between the first and second 2D material comprises interfacial states and such that in a second storage state of the memory device, interfacial states are modulated compared to the first memory state; and
- configuring the vdWh memory device for applying the erase voltage signal to the gate electrode with a zero bias voltage between the source electrode and the drain electrode.

* * * * *